US 9,503,084 B2

United States Patent
Sergi

(10) Patent No.: US 9,503,084 B2
(45) Date of Patent: Nov. 22, 2016

(54) CAPACITIVE CONTROL INTERFACES FOR DOMESTIC APPLIANCES

(71) Applicant: Whirlpool Corporation, Benton Harbor, MI (US)

(72) Inventor: Leonardo Sergi, Cassinetta (IT)

(73) Assignee: Whirlpool Corporation, Benton Harbor, MI (US)

( * ) Notice: Subject to any disclaimer, the term of this patent is extended or adjusted under 35 U.S.C. 154(b) by 19 days.

(21) Appl. No.: 14/526,927

(22) Filed: Oct. 29, 2014

(65) Prior Publication Data

US 2015/0129408 A1 May 14, 2015

(30) Foreign Application Priority Data

Nov. 12, 2013 (IT) .............................. MI2013A1877

(51) Int. Cl.
*G01R 27/26* (2006.01)
*H03K 17/96* (2006.01)
*H03K 17/98* (2006.01)

(52) U.S. Cl.
CPC ........ *H03K 17/962* (2013.01); *H03K 17/9622* (2013.01); *H03K 17/98* (2013.01); *H03K 2017/9613* (2013.01); *H03K 2217/960755* (2013.01); *H03K 2217/960765* (2013.01)

(58) Field of Classification Search
CPC ...... G06F 3/044; G06F 3/045; G06F 3/0488; G06F 3/04883; G06F 3/07886; G06F 3/0412; G06F 3/0414; G06F 3/0416; G01R 27/2605; G01D 5/24; G01D 5/2415; G01D 5/2412; G01D 5/2417; H01H 11/005; H01H 11/0056; H01L 2924/01079; H01L 2924/01078
USPC .................. 324/658–661, 686, 688, 750.17; 345/173, 174
See application file for complete search history.

(56) References Cited

U.S. PATENT DOCUMENTS 8,237,668 B2 * 8/2012 Jiang ...................... B60K 35/00
313/336
8,866,978 B2 * 10/2014 Liu ......................... G06F 3/041
349/12

(Continued)

FOREIGN PATENT DOCUMENTS

EP       2028586 A1     2/2009
WO    2006064234 A1    6/2006

OTHER PUBLICATIONS

European Search Report for Corresponding EP14190968.9, Apr. 16, 2015.

(Continued)

*Primary Examiner* — Son Le
*Assistant Examiner* — Thang Le

(57) ABSTRACT

A capacitive control interface for a domestic appliance includes an outer layer configured to be pressed by a user, a first capacitive component, a second capacitive component facing and separated from the first capacitive component, a first layer of insulating material between the outer layer and the first capacitive component, and a second layer of insulating material beneath the first layer of insulating material and in contact with the first capacitive component, the second layer having a thru hole encompassing the second capacitive component, wherein the second capacitive component faces the first capacitive component at the thru hole, and wherein the outer layer is flexibly responsive to pressure and is configured to transfer a flexure to the first capacitive component.

9 Claims, 1 Drawing Sheet

(56) References Cited

U.S. PATENT DOCUMENTS

| | | | |
|---|---|---|---|
| 2011/0050626 A1 | 3/2011 | Porter et al. | |
| 2011/0267300 A1* | 11/2011 | Serban | H03K 17/9622 345/174 |
| 2012/0090902 A1* | 4/2012 | Liu | G06F 3/045 178/18.03 |
| 2012/0217147 A1* | 8/2012 | Porter | H03K 17/962 200/600 |
| 2013/0099802 A1 | 4/2013 | Hsieh et al. | |
| 2013/0234734 A1* | 9/2013 | Iida | G06F 3/044 324/661 |
| 2014/0176159 A1* | 6/2014 | Pintiliuc | H03K 17/97 324/655 |
| 2014/0333579 A1* | 11/2014 | Sleeman | G01L 1/146 345/174 |

OTHER PUBLICATIONS

Keith Curtis et al: "mTouch Metal Over Cap Technology AN1325", Sep. 28, 2010 XP055047198 Internet—retrieved from the Internet: http://ww1.microchip.com/downloads/en/AppNotes/01325A pdf (retrieved on Dec. 10, 2012).

* cited by examiner

CAPACITIVE CONTROL INTERFACES FOR DOMESTIC APPLIANCES

RELATED APPLICATION(S)

This application claims the priority benefit of Italian Patent Application No. MI2013A001877, filed on Nov. 12, 2013, the entirety of which is incorporated herein by reference.

FIELD OF THE DISCLOSURE

This invention relates generally to domestic appliances and, more particularly, to capacitive control interfaces for domestic appliances.

BACKGROUND

Various types of interfaces are known that are capable of allowing a user to control an electrical or electronic device or equipment. With particular reference to the field of domestic appliances and even more particularly, although not limited to that of refrigerators, user interfaces are known that have mechanical, capacitive or capacitive-control pushbuttons.

BRIEF DESCRIPTION OF THE DRAWINGS

A better understanding of the invention will emerge from the following drawings, attached purely by way of a non-limiting example, in which.

DETAILED DESCRIPTION

Figure 1:
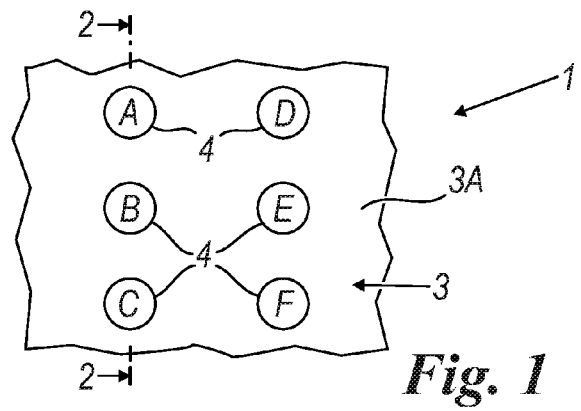
FIG. 1 shows a top view of a control interface according to the invention.

Mechanical pushbuttons comprise movable parts co-operating with electrical contacts, whose closing or opening generates a particular control signal for the domestic appliance or equipment. These buttons, however, are subject to wear and over time become not fully reliable.

Capacitive controls operate on the basis of the variation of capacitance between two facing conductors, one of which is coupled with a surface of the interface that the user is touching. These controls suffer in the event of an accumulation of electrostatic charges on said surface, however, especially when used in domestic appliances, such as refrigerators, subject to cleaning operations of the outer surface performed using woollen or synthetic cloths.

Other controls can be piezoelectric or make use of optical signals (such as infrared signals). However, these controls are costly and unsuitable for use on domestic appliances, particularly a refrigerator.

Interfaces that use inductive controls are also known. For example, WO2006/064234 describes a detector for measuring the position between two bodies, a first body comprising an electrical device and the second at least two inductors energized with an alternating current, at least one of which is formed by a planar spiral winding. In this document, the first body causes a change in inductance of the planar spiral winding and, thus, the ratio of the inductances of the second body indicates the position of the first body.

US 2011/0050626 describes an interface with inductive control touch keys and comprising illumination elements (light emitting diodes (LEDs) associated with each touch key which is made so as to transmit the light, generated by an underlying LED, onto the outside of the interface.

EP2028586 describes an inductive detector sensitive to pressure through a user interface or control interface with a metal surface. In particular, this patent concerns the fact that a first inductive component of the detector (formed by a conductor such as a disc of copper or high magnetic permeability material) is generally flat and arranged to overlay (at a distance) the second conductor, also flat, in a confronting relation.

With particular reference to the metal user interfaces of capacitive detectors, the known solutions of the state of the art do not tackle and, therefore, do not resolve the problem relating to the fact that these detectors can be subject to electrostatic discharges, particularly if located in particularly dry and windy environments in which electrostatic charges are present, or due to rubbing or by contact with electrified bodies.

In order to avoid the possibility that these discharges damage the capacitive detector, the above-mentioned interfaces provided with detectors or capacitive control buttons must be connected to earth in order to dissipate these discharges. However, when the user interface is present on a refrigerator door, its connection to earth becomes very complicated and requires interventions on the components of the domestic appliance (such as the door hinges), which are complicated and increase the refrigerator's production costs.

The aim of the present invention is to offer a capacitive user interface or control interface, with a metal outer or contact surface, which solves the problem of the possible electrostatic discharges that might damage it, without requiring the device to be connected to earth.

In particular, the aim of the invention is to offer a control interface of the above-mentioned type that is simple to make, reliable and safe to use for a user and has low production costs such as not to have a significant impact on the cost of the domestic appliance.

These and other aims, which will become clear to a person skilled in the art, will be achieved by a control interface according to this disclosure.

Figure 2:
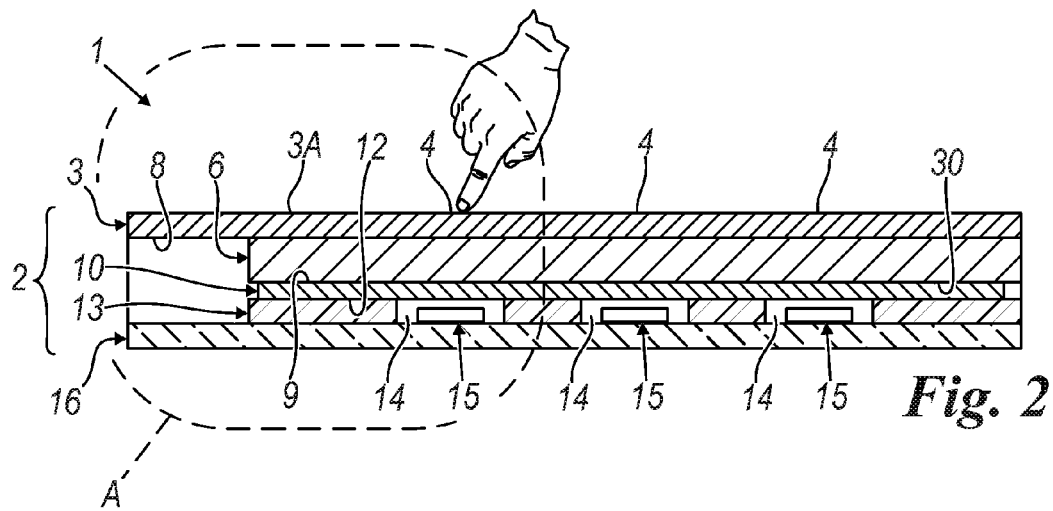
FIG. 2 shows a section along Line 2-2 in FIG. 1.
Figure 3:
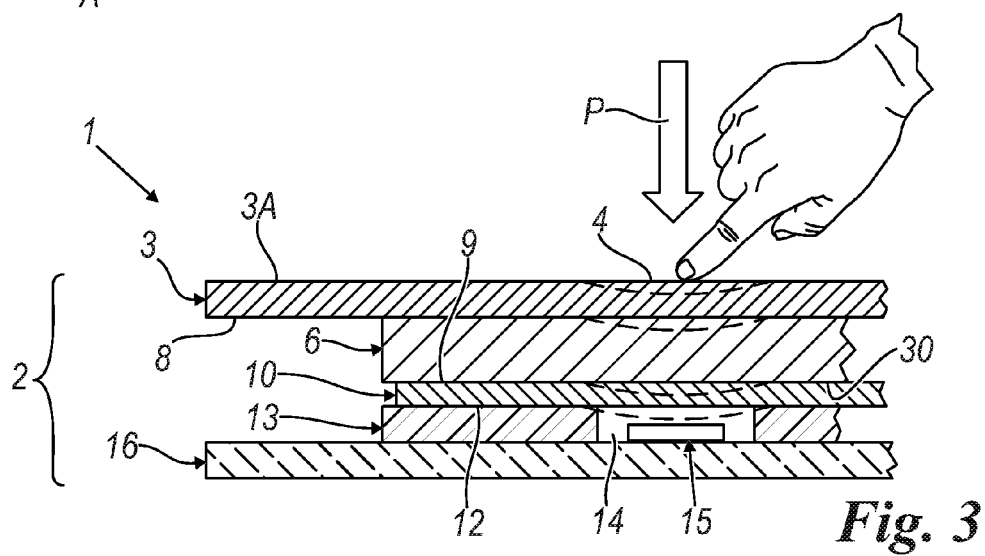
FIG. 3 shows an enlarged view of the part indicated by A in FIG. 2.

With reference to FIGS. 1 to 3, a control interface or user interface according to the invention is indicated generally by 1. It is to be used in particular in a domestic appliance and specifically in a refrigerator, for example arranged on the outer surface of a door thereof.

The interface 1 comprises a body of a layered type, that is, having various flat components associated with each other. This body has a first layer 3 having a free metal surface 3A with a plurality of control areas or "buttons" 4. Note, however, that the term "button" indicates herein the presence of areas identified by writing, numbers or something else (in the example, letters of the alphabet) corresponding to various functions of the domestic appliance, for example, the selection of the temperature of the freezer compartment or its adjustment up or down, and does not require the presence of actual buttons, that is, autonomous bodies individually movable on the surface 3A.

The layer 3, at the buttons 4, is yielding, as indicated by the dashed lines in FIG. 3, when a user presses it (see the hand in FIGS. 2 and 3 and the arrow P).

Beneath this layer 3 is a first layer 6 of insulating material, for example, the material known by the trade name "Scotch™ 7995MP" that is, for example, glued to a bottom face 8 of the above-mentioned layer 3. This layer 6 is yielding too.

The layer 6 is glued onto a top face 9 of a first capacitive component 10, which has a flat form and defines an additional layer of the interface 1. Said first capacitive component 10 is, for example, a strip of copper or other material that has high magnetic permeability and is flexible. The first capacitive component 10 can also be obtained by depositing a layer of metal on a bottom face 30 of the first insulating layer 6.

On the bottom face 12 of the first capacitive component 10 is fixed, for example glued, a second layer 13 of insulating material such as, for example, that known by the trade name of "Scotch™ 7957MP", which has a series of thru holes 14 in which are located second capacitive components 15 (e.g., spiral-shaped elements) fixed onto a bottom layer 16 of the interface 1 formed by a printed circuit. The printed circuit 16 is electrically connected to the second capacitive components 15 and detects their variation in inductance that occurs, in a known way, as a result of pressing the outer surface or layer 3. Note that the second capacitive components 15, located in the holes 14 of the second insulating layer 13, are present on the bottom layer or printed circuit 16 at the buttons 4, thus discreetly on said circuit 15.

When a user presses a control area or button 4 (see FIG. 3), all the layers 3, 6, 10 and 13 deform under the pressure P. The first capacitive component 10 bends towards the second 15 inside the hole 14 and varies its capacitance. This is detected in a known way by a logic circuit preferably located on the printed circuit 16 and the command corresponding to the button pressed is performed.

Thanks to the presence of two insulating layers 6 and 13, and the particular conformation of layer 13 (holed), the functionality of the interface 1 remains identical to that of known interfaces. However, the presence of these layers insulates the outer surface 3A of the interface from the printed circuit 16 and from any current that may be induced in the first capacitive component 10, preventing electrostatic charges from reaching the outer layer 3 and thus being sensed. The surface 3A can be covered by a special substrate capable of preventing the presence of fingerprints or made of another flexible material such as plastic.

The invention thus solves the problem of a possible presence of electrical charges on the metal outer surface of the interface, while allowing the latter to be embodied with excellent aesthetic characteristics linked precisely to it being made of metal. All this with no need to connect this outer surface to earth; a thing that would be difficult and costly to do in domestic appliances and in particular in refrigerators.

Although certain examples have been described herein, the scope of coverage of this patent is not limited thereto. On the contrary, this patent covers all methods, apparatus and articles of manufacture fairly falling within the scope of the claims of this patent.

What is claimed is:

1. A capacitive control interface for a domestic appliance, comprising:
   a metal outer layer configured to be pressed by a user;
   a first capacitive component;
   a plurality of second capacitive components facing and separated from the first capacitive component;
   a first layer of insulating material between the metal outer layer and the first capacitive component; and
   a second layer of insulating material beneath the first layer of insulating material and in contact with the first capacitive component, the second layer having a plurality of thru holes each encompassing one of the plurality of second capacitive components;
   wherein the plurality of second capacitive components face the first capacitive component at the plurality of thru holes; and
   wherein the metal outer layer and the first layer of insulating material extend over the plurality of second capacitive components and are flexibly responsive to pressure and configured to transfer a flexure to the first capacitive component.

2. The capacitive control interface as defined in claim 1, further comprising a bottom layer to which is affixed the plurality of second capacitive components, wherein the first insulating layer is affixed to a bottom face of the metal outer layer and to a top face of the first capacitive component, and wherein the second insulating layer is affixed to a bottom face of the first capacitive component and to the bottom layer.

3. The capacitive control interface as defined in claim 2, wherein the bottom layer comprises a printed circuit.

4. The capacitive control interface as defined in claim 3, wherein the printed circuit is configured to sense a change in at least one of a capacitance or an inductance due to a flexure of the metal outer layer being conveyed through the first insulating layer and first capacitive component.

5. The capacitive control interface as defined in claim 1, wherein the first capacitive component comprises a flat element.

6. The capacitive control interface as defined in claim 1, wherein the first capacitive component is formed by depositing a metal layer on a bottom face of the first layer of insulating material.

7. The capacitive control interface as defined in claim 1, wherein the first layer of insulating material and the first capacitive component are configured to be yielding and flexible at the thru holes of the second layer of insulating material.

8. The capacitive control interface as defined in claim 1, further comprising a plurality of areas of control of the domestic appliance, wherein the second insulating layer comprises the thru holes for respective ones of the areas of control.

9. A method of making a capacitive control interface for a domestic appliance to minimize electrostatic discharges, the method comprising:
   providing a metal outer layer configured to be pressed by a user;
   adhering a first layer of insulating material to the metal outer layer;
   adhering a first capacitive component to the first layer of insulating material;
   fixing a second layer of insulating material beneath the first layer of insulating material and contacting the first capacitive component, the second layer having a plurality of thru holes each encompassing a second capacitive component facing and seperated from the first capacitive component; and
   wherein the metal outer layer and the first layer of insulating material extend over the second capacitive component of each of the plurality of thru holes and are flexibly responsive to pressure and configured to transfer a flexure to the first capacitive component.

* * * * *